(12) United States Patent
Godet et al.

(10) Patent No.: US 8,778,465 B2
(45) Date of Patent: Jul. 15, 2014

(54) ION-ASSISTED DIRECT GROWTH OF POROUS MATERIALS

(75) Inventors: Ludovic Godet, Boston, MA (US); Xiangfeng Lu, Beverly, MA (US); Deepak Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 148 days.

(21) Appl. No.: 13/469,750

(22) Filed: May 11, 2012

(65) Prior Publication Data

US 2012/0289030 A1 Nov. 15, 2012

Related U.S. Application Data

(60) Provisional application No. 61/486,301, filed on May 15, 2011, provisional application No. 61/505,434, filed on Jul. 7, 2011.

(51) Int. Cl.
| | |
|---|---|
| H05H 1/24 | (2006.01) |
| H01J 37/32 | (2006.01) |
| H01L 31/028 | (2006.01) |
| C23C 16/24 | (2006.01) |
| C23C 16/04 | (2006.01) |
| C23C 16/505 | (2006.01) |
| H01L 31/0216 | (2014.01) |

(52) U.S. Cl.
CPC ........... *C23C 16/24* (2013.01); *H01J 37/32082* (2013.01); *H01L 31/0284* (2013.01); *C23C 16/045* (2013.01); *C23C 16/505* (2013.01); *H01L 31/02168* (2013.01); *Y02E 10/50* (2013.01)

USPC ........ 427/569; 427/331; 427/372.2; 427/574; 427/578; 427/579

(58) Field of Classification Search
USPC ............... 427/569, 574, 578, 579, 331, 372.2
See application file for complete search history.

(56) References Cited

U.S. PATENT DOCUMENTS

| | | | | |
|---|---|---|---|---|
| 5,156,896 | A * | 10/1992 | Katoh et al. | 428/81 |
| 5,421,958 | A | 6/1995 | Fathauer et al. | |
| 5,427,648 | A | 6/1995 | Pamulapati et al. | |
| 5,458,756 | A | 10/1995 | Bassous et al. | |
| 5,965,005 | A | 10/1999 | Lee et al. | |
| 6,103,590 | A | 8/2000 | Swanson et al. | |
| 6,399,177 | B1 * | 6/2002 | Fonash et al. | 428/119 |
| 2002/0086463 | A1 * | 7/2002 | Houston et al. | 438/148 |
| 2004/0207042 | A1 * | 10/2004 | McCormack et al. | 257/532 |
| 2005/0051517 | A1 * | 3/2005 | Oehrlein et al. | 216/67 |

(Continued)

OTHER PUBLICATIONS

Aydil, E.S., et al., Incidence Angle Distributions of Ions Bombarding Grounded Surfaces in High Density Plasma Reactors, Materials Science in Semiconductor Processing, Apr. 1, 1998, pp. 75-82, vol. 1, No. 1, Elsevier Science Ltd. Amsterdam, The Netherlands.

*Primary Examiner* — Elizabeth Burkhart

(57) ABSTRACT

Methods of creating porous materials, such as silicon, are described. In some embodiments, plasma sheath modification is used to create ion beams of various incidence angles. These ion beams may, in some cases, form a focused ion beam. The wide range of incidence angles allows the material to be deposited amorphously. The porosity and pore size can be varied by changing various process parameters. In other embodiments, porous oxides can be created by adding oxygen to previously created layers of porous material.

20 Claims, 10 Drawing Sheets

(56) References Cited

U.S. PATENT DOCUMENTS

| | | |
|---|---|---|
| 2006/0078680 A1 | 4/2006 | Nakano et al. |
| 2008/0132046 A1* | 6/2008 | Walther .................. 438/513 |
| 2008/0179546 A1 | 7/2008 | Lee et al. |
| 2008/0242065 A1 | 10/2008 | Brcka |
| 2010/0252531 A1 | 10/2010 | Godet et al. |
| 2010/0255683 A1* | 10/2010 | Godet et al. .................. 438/710 |

* cited by examiner

ION-ASSISTED DIRECT GROWTH OF POROUS MATERIALS

This application claims priority of U.S. Provisional Patent Application Ser. No. 61/486,301, filed May 15, 2011 and U.S. Provisional Patent Application Ser. No. 61/505,434, filed Jul. 7, 2011, the disclosures of which are incorporated herein by reference in their entireties.

FIELD

This invention relates to fabrication of porous materials, such as porous silicon and porous silicon dioxide, and more particularly, to the deposition of these porous materials and pore size control.

BACKGROUND

Porous silicon has attracted more interest lately, especially due to its excellent properties related to applications in detectors and sensors, including gas sensors, humidity sensors, and biosensors, super capacitor, silicon-based optoelectronics, including electroluminescent displays and photodetectors, chemical and biological filters, and solar cells. In addition, porous silicon is also an ideal biomaterial due to its good biocompatibility for use in semiconductor optoelectronic devices linked to living tissues, its bioactive properties for medical implant, its non-toxic advantage over other semiconductors, its highly controllable properties by varying the porosity, and porosity dependent optical properties for medical imaging.

Additionally, in semiconductor manufacturing, a low-k dielectric is a material having a small dielectric constant compared to silicon dioxide. Low-k dielectric material implementation is one of several strategies used to allow the continued miniaturization of microelectronic devices. In digital circuits, insulating dielectrics separate the conducting parts, such as wire interconnects and transistors, from one another. As components have scaled and transistors have become spaced closer together, the thickness of the insulating dielectrics has decreased to the point where charge buildup and crosstalk adversely affects the performance of the device. Replacing silicon dioxide with a low-k dielectric material of the same thickness reduces parasitic capacitance, enabling faster switching speeds and lower heat dissipations.

One such low-k dielectric material is porous silicon dioxide. Air has a dielectric constant of roughly 1.0005, thus the dielectric constant of a material may be lowered by increasing the porosity of the material. Porous silicon dioxide may be formed by incorporating oxygen in a porous silicon layer.

Although porous silicon has been studied for over 30 years, there has not been much improvement in the growth technique since the invention of porous silicon. The widely used method to produce porous silicon is anodization. FIG. 1 shows the common method using to create porous silicon. A hydrogen fluoride (HF) solution 10 is prepared in a container 20, such as a Teflon container. A silicon substrate 30 is placed in the solution 10. A platinum cathode 40 is dipped into a hydrogen fluoride (HF) solution 10. The platinum cathode and the silicon substrate 30 are connected to the negative and positive sides of a power source 50, respectively. Current passing through the solution 10 allows the growth of porous silicon on the surface of the silicon substrate 30. The complicated fabrication steps and high fabrication cost are significant bottlenecks for the fabrication of new porous silicon-based devices. In addition, this process is not compatible with the standard silicon process. Further, this process can only be used to make crystalline porous silicon. For some applications, amorphous porous silicon may be required.

Therefore, there is a need for an improved method of creating porous materials, such silicon. Further, there is a need to control the formation of that silicon so that the pore size can be regulated. In addition, there is a need for an improved method of creating porous oxides, such as silicon dioxide.

SUMMARY

Methods of creating porous materials, such as silicon, are described. In some embodiments, plasma sheath modification is used to create ion beams of various incidence angles. These ion beams may, in some cases, form a focused ion beam. The wide range of incidence angles allows the material to be deposited amorphously. The porosity and pore size can be varied by changing various process parameters. In other embodiments, porous oxides can be created by adding oxygen to previously created layers of porous material.

BRIEF DESCRIPTION OF THE DRAWINGS

For a better understanding of the present disclosure, reference is made to the accompanying drawings, which are incorporated herein by reference and in which.

DETAILED DESCRIPTION

The creation of a porous material, such as silicon, and the control of the various parameters, such as pore size and porosity, are becoming increasingly important as the interest in porous materials grows. New methods of forming porous materials, such as silicon and silicon dioxide, using ion-assisted deposition are disclosed.

Figure 1:
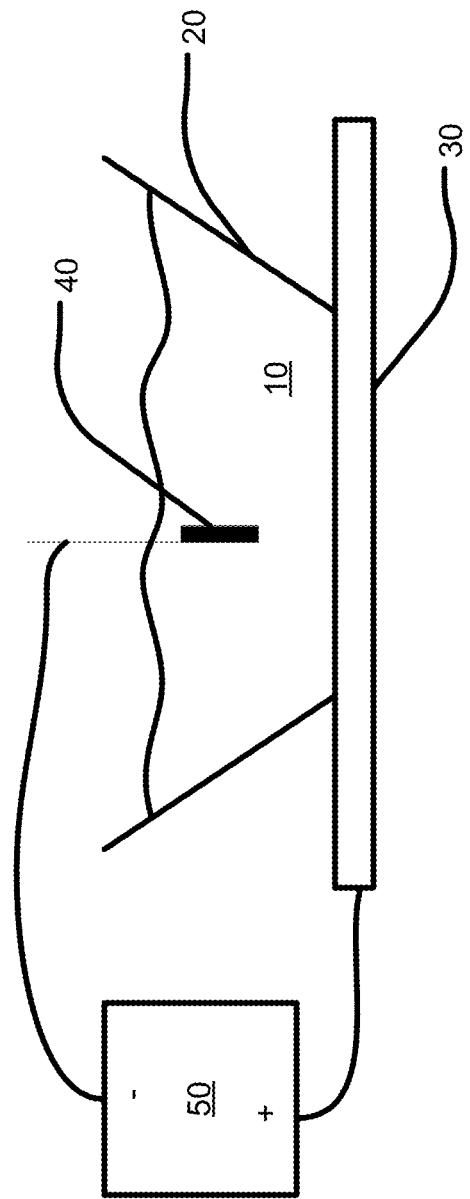
FIG. 1 is an example of porous silicon fabrication according to the prior art.
Figure 2:
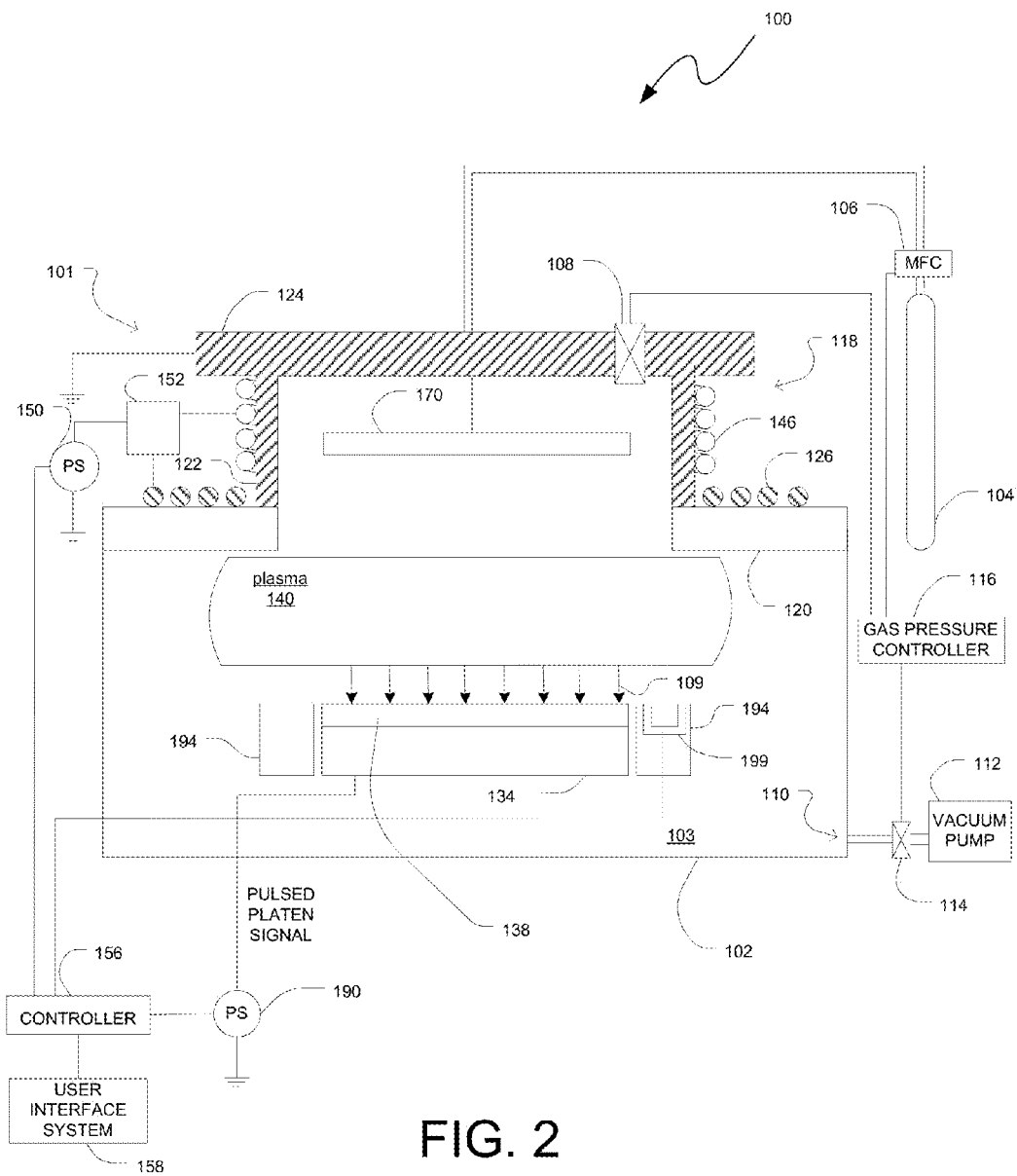
FIG. 2 is a plasma processing apparatus.

Deposition can be performed in a number of ways. Turning to FIG. 2, a block diagram of one exemplary plasma processing apparatus 100 is illustrated. The plasma processing apparatus 100 includes a process chamber 102 defining an enclosed volume 103. A gas source 104 provides a primary gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma processing apparatus 100 may further include a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma processing apparatus further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma processing apparatus may also include a bias power supply 190 electrically coupled to the platen 134. The plasma doping system may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma doping apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current.

In operation, the gas source 104 supplies a primary gas containing a desired dopant for introduction to the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 190 provides a platen signal to bias the platen 134 and hence the workpiece 138 to accelerate ions 109 from the plasma 140 towards the workpiece 138. The ions 109 may be positively charged ions and hence the ON periods of the platen signal may be negative voltage pulses with respect to the process chamber 102 to attract the positively charged ions. The amplitude of the platen signal may be selected to provide a desired energy.

To create porous material via deposition, a reaction gas, such as hydride based feedstock, including $CH_4$, $SiH_4$, di-silane or $GeH_4$, is introduced into the plasma processing chamber 102. In some embodiment, a fluorine based feedstock, such as $SiF_4$ or $CF_4$ also may be used as a reaction gas. The pressure within the chamber 102 is preferably maintained at very low pressure, such as between 1 mTorr and 20 mTorr. In some embodiments, a pressure of about 5 mTorr is used. Porous silicon may be best fabricated by increasing the ionization rate of the reaction gas. In one embodiment, the reaction gas is diluted with molecular hydrogen, such that the concentration of the reaction gas is less than, for example, 5%. In some embodiments, RF power of between about 1 kW and 5 kW is used to ionize the reaction gas. While highly diluted reaction gas is used in some embodiments, in other embodiments, concentrations of reaction gas up to about 80% may be mixed with a noble gas, such as helium, neon, argon, krypton, or xenon, or hydrogen. In some embodiments, the diluent gas may contain a species that is intended to be deposited as well. For example, a diluent gas such as $N_2$ or $NH_3$ may be used in conjunction with $SiH_4$ to deposit both silicon and nitrogen. Other diluent gasses include $CH_4$, other alkanes, or other hydrocarbons, which would allow the deposition of carbon. Of course, in some embodiments, two different reaction gasses are used to produce ions of two different species. These two reaction gasses may be diluted with a noble gas or hydrogen, as described above.

A second factor in the growth of porous materials, such as porous silicon, is the bias voltage applied by the bias power supply 190. For example, a strong bias voltage may cause the ions 109 to accelerate too quickly toward the workpiece 138, thereby damaging the workpiece 138 surface. Therefore, the bias force at the beginning of the deposition may be low, such as about 500V. As the deposition thickness increases, the bias voltage can be ramped up to increase the deposition speed. In this way, damage to the workpiece 138 can be minimized because the initial deposition will shield or mask the surface of the workpiece 138. For example, in one embodiment, the bias voltage is maintained at 500V for one minute and then ramped to about 3 KV or higher for the remainder of the deposition process. This reduces processing time.

Figure 3:
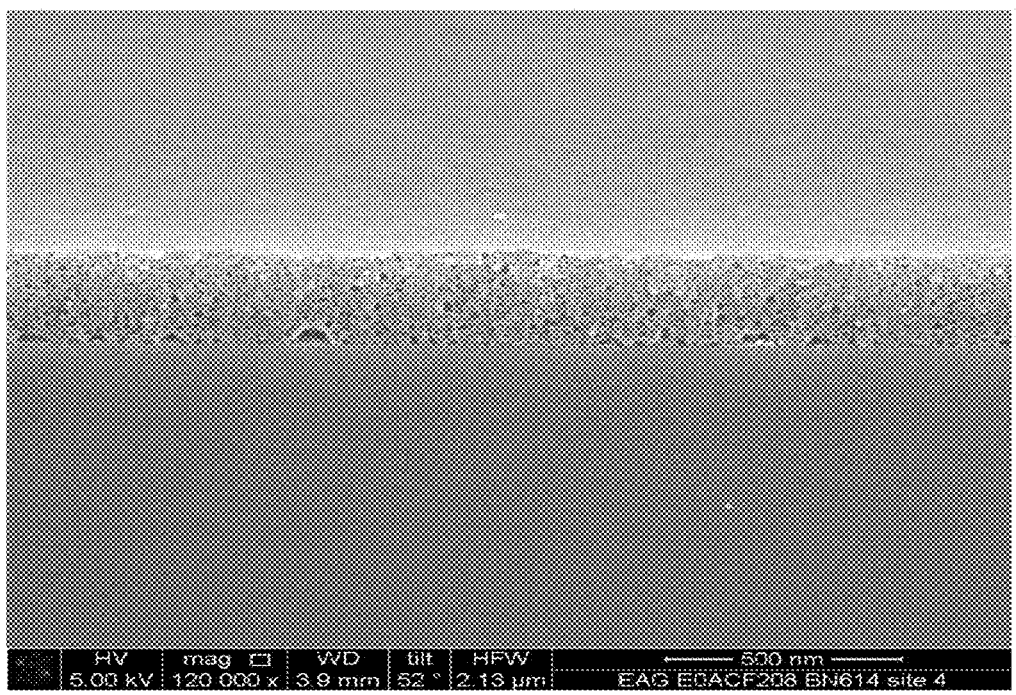
FIG. 3 is a view of a porous silicon layer fabricated using ion-assisted deposition.

In addition to fabricating porous materials, such as silicon, through ion-assisted deposition, various characteristics of the porous material can be controlled and varied. For example, two important characteristics of porous silicon are porosity and pore size. These parameters are advantageously controlled by modification of certain operating conditions within the chamber 102. For example, pore size and porosity may be modified by adjusting the ratio of ions to neutral species in the plasma 140. For example, greater porosity and pore size may be achieved by changing this ratio. This ratio can be affected by varying the reaction gas ($SiH_4$) flux, concentration and RF power. For example, a 15% mixture of $SiH_4$ at 5 mTorr allowed the fabrication of a porous silicon structure with high porosity and a pore size less than 20 nm. The remainder of the mixture may be hydrogen, helium or neon. FIG. 3 shows the porous silicon created using this configuration. Note also that the surface shows high quality with low levels of roughness. In other embodiments, the concentration of reaction gas, such as $SiH_4$, is varied, such as from 5-50%, to modify the pore size and porosity. Of course, other ratios or concentrations are possible.

In some embodiments, larger pore size and porosity can be achieved by increasing RF power, decreasing reaction gas concentration, or lowering pressure. In some embodiments, the ion angular distribution is used to control the pore distribution and the pore size. For example, normal incidence ions are difficult to use in order to create porous silicon, while a wide range of incident angles or a focused ion beam, both of which may be created using sheath engineering, may allow creation of porous silicon. Plasma sheath modification may be used to change the incident angle of the ions and therefore, the pore size and porosity.

Figure 4:
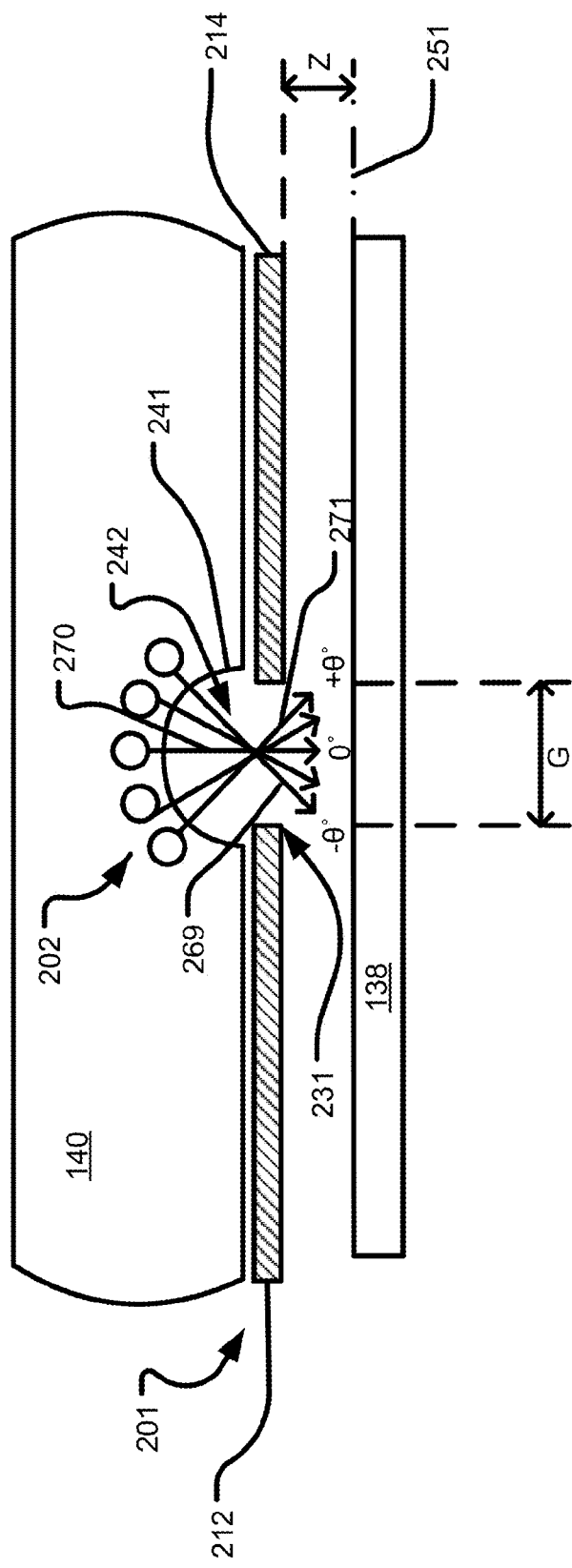
FIG. 4 is a cross-section view of an embodiment of sheath modification.

FIG. 4 is a block diagram of a plasma processing apparatus having a plasma sheath modifier. The plasma 140 is generated as is known in the art. This plasma 140 is generally a quasi-neutral collection of ions and electrons. The ions typically have a positive charge while the electrons have a negative charge. The plasma 140 may have an electric field of, for example, approximately 0 V/cm in the bulk of the plasma 140. In a system containing the plasma 140, ions 202 from the plasma 140 are attracted toward a workpiece 138. These ions 202 may be attracted with sufficient energy to be implanted into the workpiece 138. The plasma 140 is bounded by a region proximate the workpiece 138 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, few excitation-relaxation collisions occur. Thus, the plasma sheath 242 is sometimes referred to as "dark space."

The plasma sheath modifier 201 is configured to modify an electric field within the plasma sheath 242 to control a shape of a boundary 241 between the plasma 140 and the plasma sheath 242. Accordingly, ions 202 that are attracted from the plasma 140 across the plasma sheath 242 may strike the workpiece 138 as a focused ion beam. This plasma sheath modifier 201 may be referred to as, for example, a focusing plate or sheath engineering plate.

In the embodiment of FIG. 4, the plasma sheath modifier 201 includes a pair of panels 212 and 214 defining an aperture 231 there between having a horizontal spacing (G). The panels 212 and 214 may be an insulator, semiconductor, or conductor. In other embodiments, the plasma sheath modifier 201 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture 231. The panels 212 and 214 also may be positioned a vertical spacing (Z) above the plane 251 defined by the front surface of the workpiece 138. In one embodiment, the vertical spacing (Z) may be between about 0.0 to 10.0 mm.

Ions 202 may be attracted from the plasma 140 across the plasma sheath 242 by different mechanisms. In one instance, the workpiece 138 is biased to attract ions 202 from the plasma 140 across the plasma sheath 242. In another instance, a plasma source that generates the plasma 140 and walls surrounding the plasma 140 are biased positively and the workpiece 138 may be grounded. The biasing may be pulsed in one particular embodiment. In yet another instance, electric or magnetic fields are used to attract ions 202 from the plasma 140 toward the workpiece 138.

Figure 9:
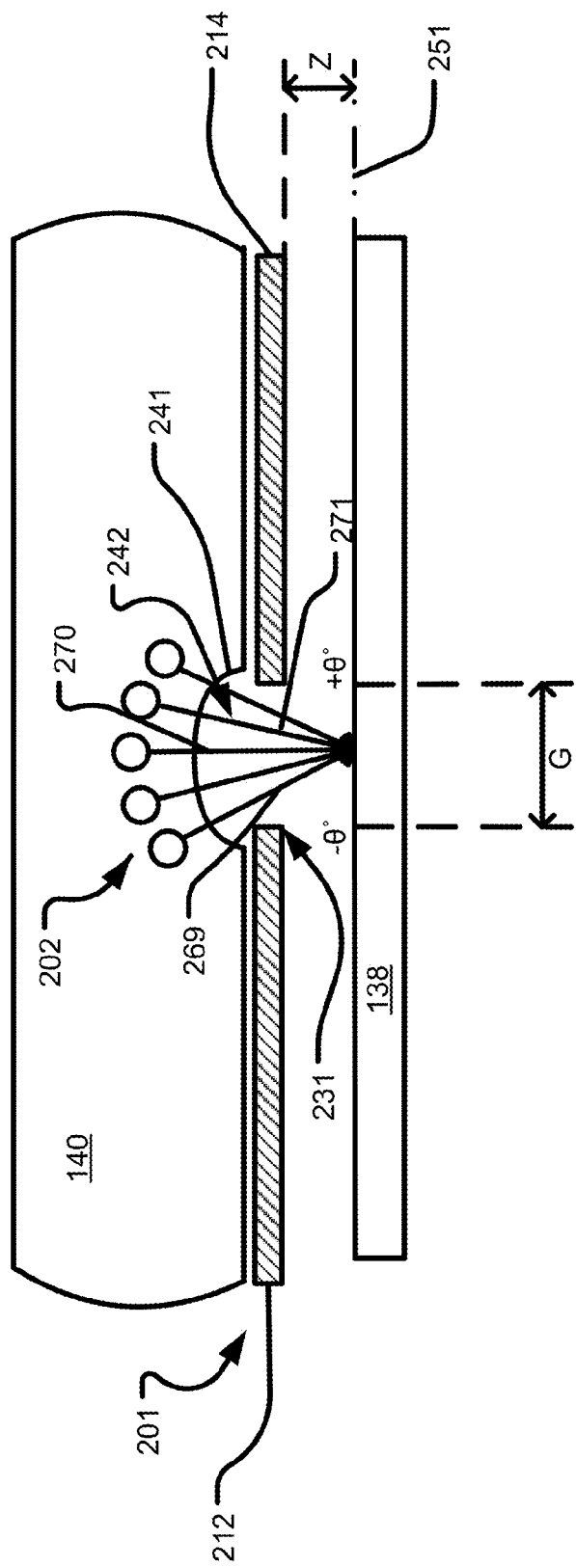
FIG. 9 shows an embodiment of sheath modification which can be used to create a focused ion beam.

Advantageously, the plasma sheath modifier 201 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 251 in one instance. When the workpiece 138 is biased, for example, the ions 202 are attracted across the plasma sheath 242 through the aperture 231 between the panels 212 and 214 at a large range of incident angles. For instance, ions 202 following trajectory path 271 may strike the workpiece 138 at an angle of $+\theta°$ relative to the plane 251. Ions 202 following trajectory path 270 may strike the workpiece 138 at about an angle of 0° relative to the same plane 251. Ions 202 following trajectory path 269 may strike the workpiece 138 an angle of $-\theta°$ relative to the plane 251. Accordingly, the range of incident angles may be between $+\theta°$ and $-\theta°$ centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 251, the dielectric constant of the panels 212 and 214, or other process parameters of the plasma 140, the range of incident angles ($\theta$) may be between +60° and −60° centered about 0°. In other embodiments, the plasma sheath modifier 201 is used to create a focused ion beam, which is directed toward the workpiece 138. FIG. 9 shows how sheath modifier 201 can be used to create a focused ion beam. In this embodiment, the horizontal spacing (G) and vertical spacing (Z) are selected such that all of the incident ion beams converge at a single point or region. In this embodiment, the incident ions 202 may arrive at a plurality of incident angles ($\theta$), but all reach the same region of the workpiece 138.

Figure 5:
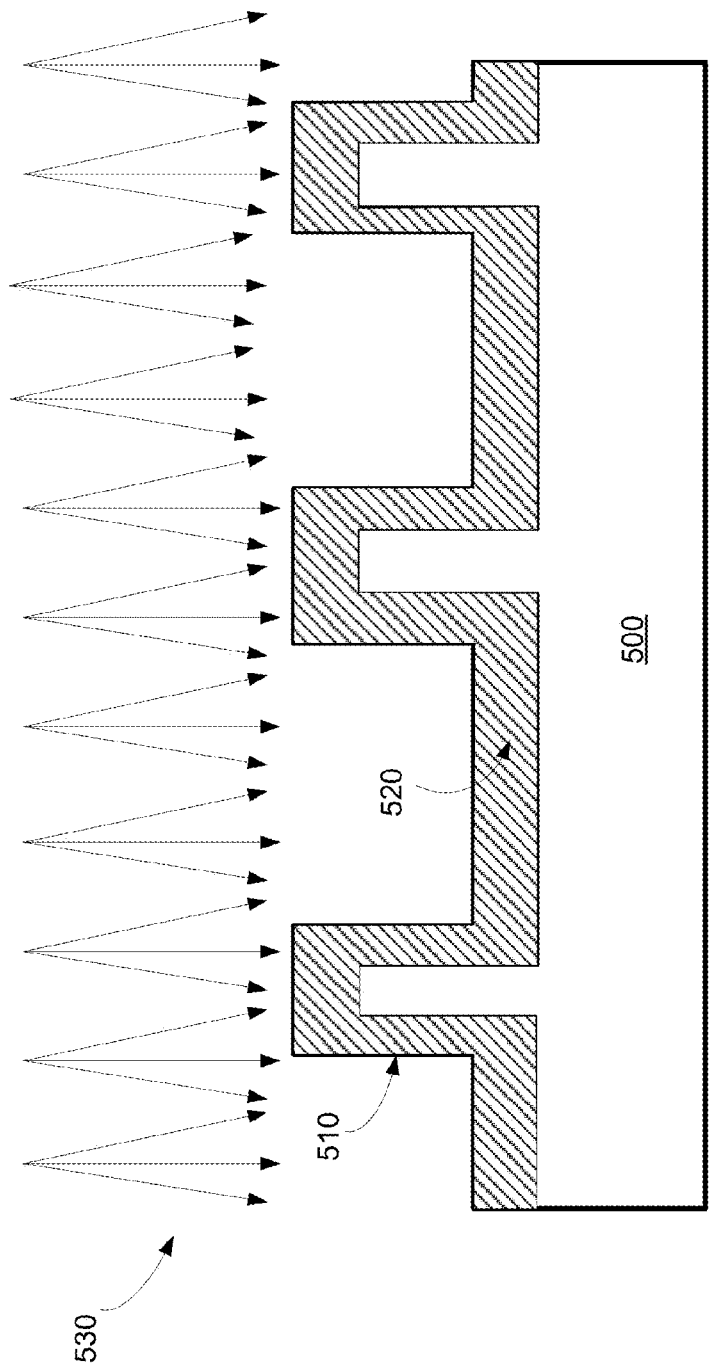
FIG. 5 shows deposition using sheath modification.

Through the use of plasma sheath modification, porous silicon can be deposited onto non-planar surfaces, such as trench structures or nano-holes. Using the apparatus of FIG. 4, porous silicon can be more uniformly deposited on non-horizontal structures. With ions that have a parallel trajectory, it may be difficult to implant all surfaces in a single step. FIG. 5 shows the deposition pattern of porous silicon with sheath modification. Ions 530 are deposited at a plurality of angles. Therefore, the porous silicon 520 is deposited on all surfaces of the workpiece 500, including vertical surfaces 510. In another instance, the embodiment of FIG. 5 can be varied such that the thickness or properties of the porous silicon is different on the different surfaces. This may be performed by adjusting the ion spread or relative doses within the ion spread. For example, a bimodal distribution of ions may enable different doses on the vertical surfaces than the horizontal surfaces.

Figure 6A:
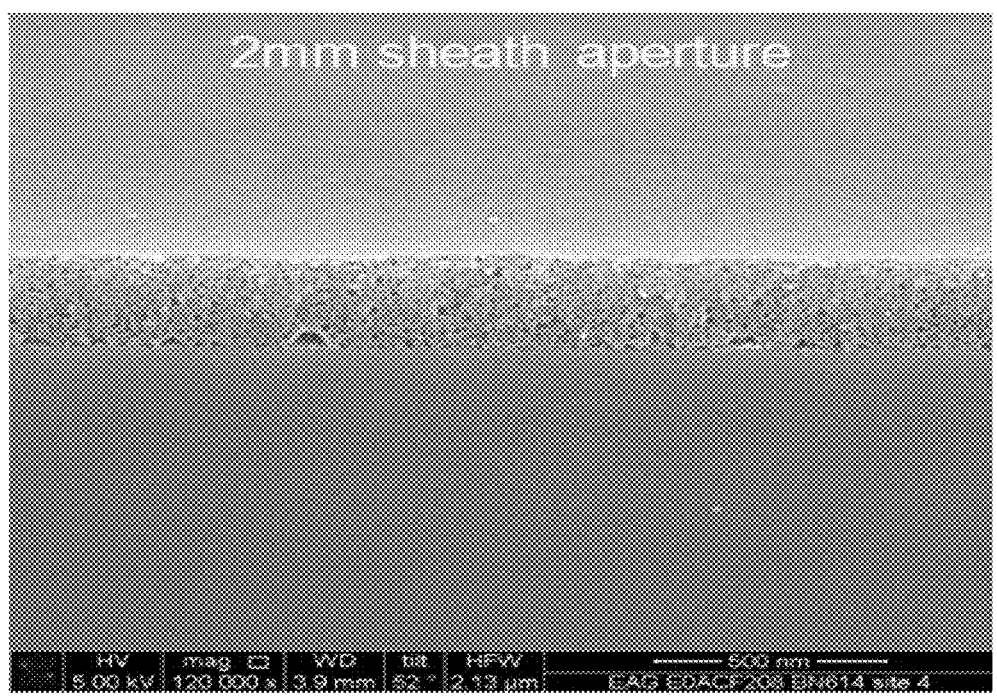
FIGS. 6A-B show cross-sectional views of porous silicon fabricated using two different aperture widths.
Figure 6B:
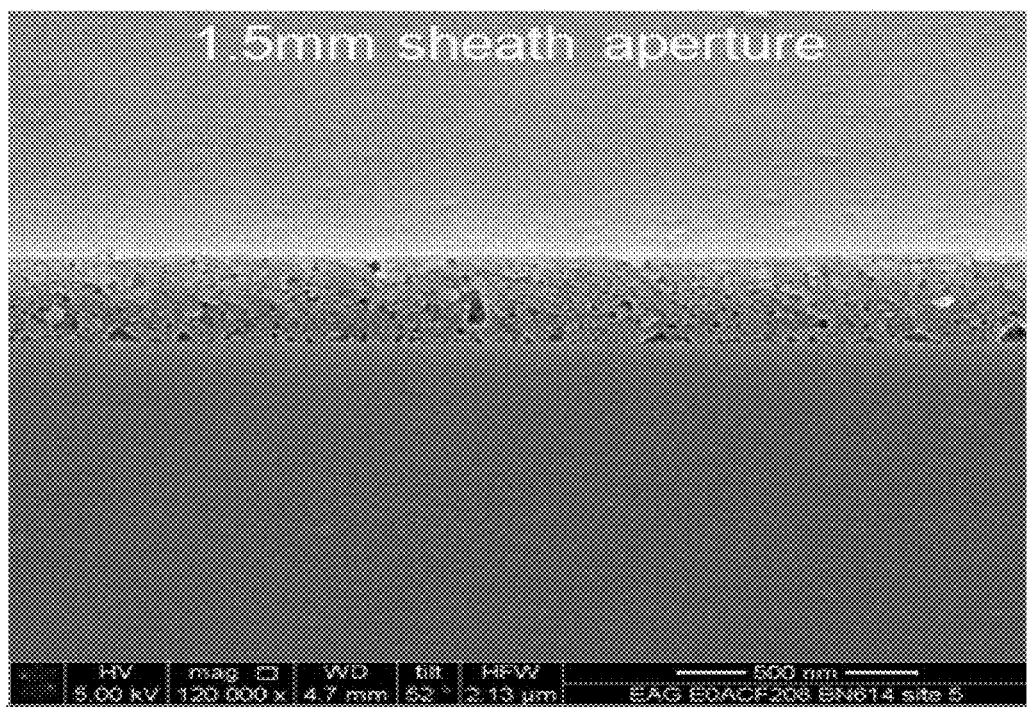

In another embodiment, sheath modification may be used to control the pore size and porosity of the porous silicon. In some embodiments, the pore size and porosity vary with the width of aperture 231 (see FIG. 4). FIG. 6A shows the porous silicon produced using an aperture 231 having a width of 2 mm. FIG. 6B shows the porous silicon produced using an aperture 231 having a width of 1.5 mm. Looking at FIGS. 6A-B, it may be seen that with an increase in the width of aperture 231, smaller pore size and porosity of the porous silicon were achieved. Changing the aperture width necessarily changes the incident angular distribution and the focused ion beam. In addition, the effective plasma interaction density changes. In some embodiments, the width of the aperture may be between about 1 mm and 30 mm. This result also may occur with other porous materials besides porous silicon.

Since the width of aperture 231 is known to affect the range of incident angles ($\theta$), it may be that other parameters, which also affect incident angle, may also affect porosity and pore size in porous materials such as porous silicon. For example, the horizontal spacing (G) of aperture 231, the vertical spacing (Z) of the panels 212 and 214 above the plane 251, the dielectric constant of the panels 212 and 214, or other process parameters of the plasma 140, such as chamber pressure, gas flux and RF power may also be used to modify the pore size and porosity of the porous silicon. In addition, a bimodal incident angle distribution, created by varying the heights of panels 212 and 214 relative to each other, or a wide incident angle distribution, not centered at 0°, may also be used in conjunction with a temperature of between 200° C. and 800° C. to control the grain size and orientation, and may also affect the porosity level.

In another embodiment, the temperature at which the ion-assisted depositions described above are performed is varied. Temperature may be a factor in improving the quality of deposited films by reducing the number of defects inside the film. For example, amorphous porous silicon films can be created under low temperature. Increased temperature may produce crystalline porous silicon with fewer defects. In some embodiments, temperatures between −200° C. and 700° C. are used. In another embodiment, temperatures between 100° C. and 400° C. are used.

In another embodiment, maskless selective deposition of porous silicon is achieved by ion-assisted deposition, which depends on an external bias voltage to draw the ions toward the surface to be deposited. Active neutral species in the plasma are unaffected by bias voltage and therefore will be evenly deposited on all surfaces (both biased and non-biased). Therefore, by reducing the concentration of active neutral species in the plasma, it is guaranteed that the primary deposition method is ion-assisted deposition and the silicon is only deposited on biased surfaces. This may be achieved by lowering the pressure within the chamber, or by increasing the RF power. Therefore, by varying the regions that are biased, a patterned deposition can be achieved. In the case where porous silicon is deposited on silicon, a pre-step may be required to remove the native oxide. Once removed, the crystalline porous silicon can be fabricated.

As seen in the above description, the use of ion-assisted deposition has many advantages over the traditional methods of porous silicon fabrication or other porous material fabrication. These include fewer side effects due to direct growth on existing devices, simplified fabrication steps and lower cost, capability of maskless patterned deposition, capability for growth on non-horizontal surfaces, and control of pore size and porosity by varying plasma parameters and ambient temperature. Patterned or selective deposition on only a fraction of or in particular regions of a workpiece also is possible. The bias to the workpiece or plasma parameters may be adjusted while the workpiece is scanned, for instance.

In some embodiments, porous materials may be formed by thermally treating the previously created porous material in an oxygen rich environment. For example, silicon dioxide may be created by thermally treating porous silicon. In other embodiments, porous oxides are created by implanting oxygen ions into a previously created layer of porous material. For example, porous silicon dioxide may be formed by implanting oxygen ions in a porous silicon layer, and thermally treating the material afterwards. Thus, any of the methods described above may be used to create a layer of porous material, such as porous silicon. Once a layer has been grown, it can then be changed into a porous oxide, such as silicon dioxide, by the introduction of oxygen.

Figure 7:
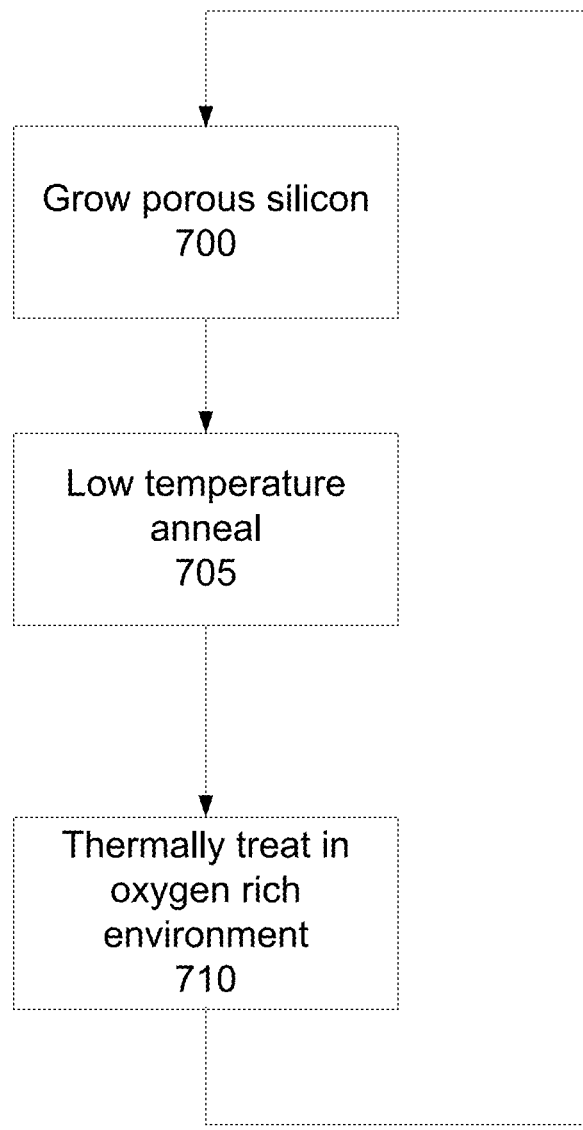
FIG. 7 shows a first process of creating porous silicon dioxide.

In one embodiment, shown in FIG. 7, the grown silicon layer is thermally treated in an oxygen rich environment, so as to introduce oxygen to the porous silicon. In some embodiments, a layer of porous silicon is grown using any of the above techniques, as shown in step 700. This layer may be about 10 nm, although other thicknesses are also within the scope of the disclosure. This grown layer may be optionally thermally treated at a low temperature, such as less than 400° C., to allow hydrogen atoms to escape from the silicon layer, as shown in step 705. In other embodiments, this step 705 is not performed. The layer is then thermally treated, as shown in step 710, in an oxygen rich environment, such as at a temperature above 400° C. This allows the oxygen to chemically combine with the porous silicon to form porous silicon dioxide. In another embodiment, a millisecond anneal or laser anneal is performed. These steps 700, 705, 710 can then be repeated until the desired thickness of silicon dioxide is achieved. In some embodiments, a plasma chamber is used to create a plasma containing oxygen, where the oxygen ions are allowed to deposit on the silicon, without the use of a bias voltage. The embodiment of FIG. 7 also can be performed with other porous materials.

Figure 8:
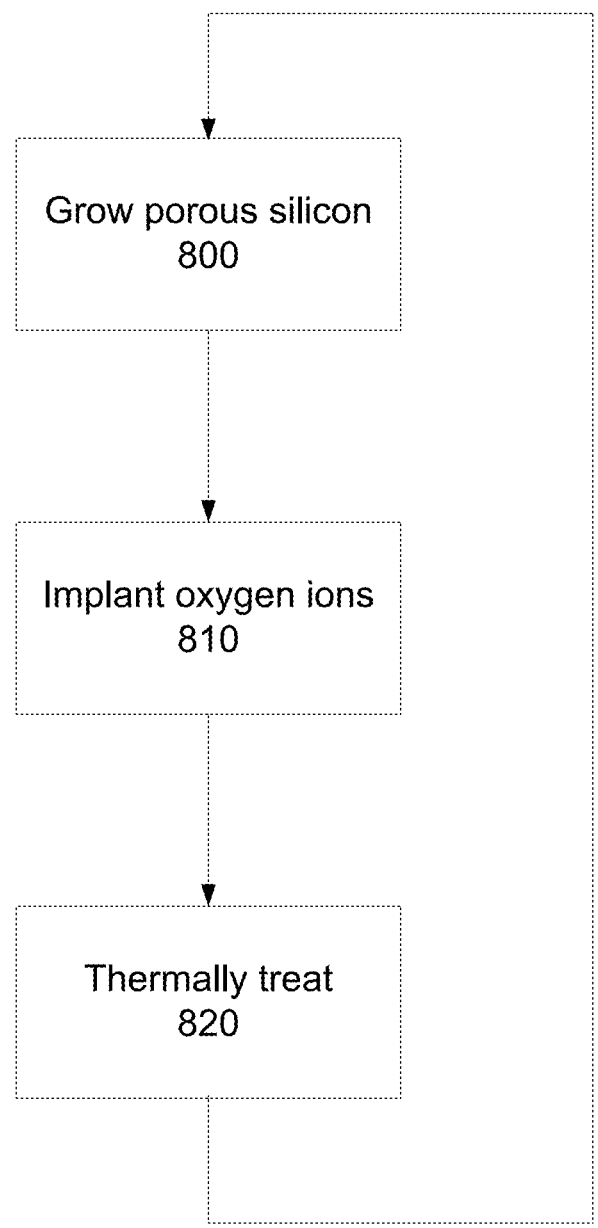
FIG. 8 shows a second process of creating porous silicon dioxide.

In another embodiment, shown in FIG. 8, the grown silicon layer is implanted with oxygen ions, such as by using a beam-line implanter, PLAD implanter, an implanter that modifies a plasma sheath, or a focused beam implanter. Other methods of implanting ions can also be used and are within the scope of the disclosure. A thin layer of porous silicon is grown, as shown in step 800, using any of the techniques described above. After the layer is grown, it is subjected to ion implantation of oxygen ions, as shown in step 810. This implant is preferably done at low energy so as not to affect the pore size or porosity of the porous silicon. In the case of a PLAD implanter, oxygen ions are created using plasma, and directed toward the silicon by the application of bias voltage. After the oxygen ions are implanted, the porous silicon may be thermally treated by low temperature anneal, rapid thermal anneal, furnace, millisecond anneal, laser anneal of other means, as shown in step 820, so as to cause the oxygen and silicon to chemically combine. Again, these steps 800, 810, 820 may be done multiple times to attain the desired thickness of silicon dioxide. The embodiment of FIG. 8 also can be performed with other porous materials.

The previous embodiments require separate process steps to deposit the silicon and the oxygen ions. These steps may be done in separate processing chambers, or may be performed sequentially in one chamber.

In another embodiment, the silicon and oxygen are deposited at least partially simultaneously. In this embodiment, rather than using silane as the dopant gas for a deposition process, $SiF_4$ is used. This gas is mixed with oxygen and both gases are supplied to the PLAD chamber, so that both silicon and oxygen may be deposited simultaneously. This can be used with the deposition and plasma sheath techniques described above. After the deposition process is completed, a thermal cycle is performed to cause the silicon and oxygen to chemically combine, forming silicon dioxide. Other porous oxide materials also may be formed using a reaction gas and oxygen.

If multiple reaction gasses are used, various oxides can be produced. For example, combinations of different reaction gasses can be used to create materials such as SiCON, SiCO, BsiCO or BSICON. In these cases, SiH4 and at least one other gas, such as $N_2$, $NH_3$ or $CH_4$, are ionized to create the porous material, which is then oxidized as described above.

While the disclosure describes ion-assisted fabrication to create porous silicon, the disclosure is not limited to this embodiment. For example, these methods may be used to fabricate other porous materials, including but not limited to porous carbon and porous germanium. Other porous materials, comprising more than one species, including but not limited to porous GaN, porous Zn, porous ZnTe, and other porous compound semiconductors can also be created. By changing the reaction gas or using more than one reaction gas, any of these materials can be deposited to become a porous material. In addition, although the disclosure describes PLAD and sheath modification, other processes may also be used. Any focused ion beam or another plasma tool that modifies the plasma sheath may be used to perform these methods.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating a layer of porous material on a workpiece, comprising:
   introducing a reaction gas into a chamber;
   ionizing said reaction gas so as to create a plasma;
   modifying a sheath of said plasma so as to create a plurality of ion beams of different incident angles; and
   applying a voltage to said workpiece so that said plurality of ion beams are directed toward said workpiece, wherein said ion beams form said layer of porous material.

2. The method of claim 1, wherein said ionizing step comprising supplying RF power to an antenna, said antenna generating energy to ionize said reaction gas.

3. The method of claim 2, wherein said RF power is between about 1 kW and 5 kW.

4. The method of claim 1, wherein said modifying step comprises inserting a sheath modifier between said plasma and said workpiece, said sheath modifier having an aperture therein to allow said ion beams to pass through, wherein said sheath modifier is positioned a distance from said workpiece, wherein said distance is between 0.0 mm and 10.0 mm.

5. The method of claim 4, wherein a width of said aperture is between 1.0 mm and 30 mm.

6. The method of claim 1, wherein pressure with said plasma chamber is between about 1 mTorr and 20 mTorr.

7. The method of claim 1, wherein said reaction gas comprises a hydride based molecule.

8. The method of claim 1, wherein said reaction gas is diluted with a second gas, said second gas selected from the group consisting of hydrogen and a noble gas.

9. The method of claim 8, wherein a concentration of said reaction gas is between 5-50%.

10. The method of claim 1, wherein said voltage applied is increased over time.

11. The method of claim 10, wherein said voltage is between 500V and 3000V.

12. The method of claim 1, wherein said layer of porous material is selected from the group consisting of silicon, carbon, germanium, GaN, zinc, and ZnTe.

13. The method of claim 1, further comprising thermally treating said formed layer in an oxygen rich environment at a temperature above 400° C. to create a porous oxide.

14. The method of claim 13, further comprising thermally treating said formed layer at a low temperature prior to said thermal treatment in said oxygen rich environment, wherein said low temperature is less than 400° C.

15. The method of claim 1, further comprising implanting oxygen into said layer to create a porous oxide.

16. The method of claim 1, wherein more than one reaction gas is introduced, and comprising thermally treating said formed layer in an oxygen rich environment at a temperature above 400° C. to create a porous oxide.

17. The method of claim 1, wherein more than one reaction gas is introduced, and comprising implanting oxygen into said formed layer to create a porous oxide.

18. The method of claim 1, wherein said plurality of ion beams of different incident angles converge at a single point or region.

19. The method of claim 1, further comprising introducing oxygen into said chamber with said reaction gas, such that ions from said reaction gas and said oxygen are directed toward said workpiece, so as to form a porous oxide.

20. The method of claim 19, further comprising performing a thermal process after said layer of porous material is formed, such that ions from said reaction gas and said oxygen disposed in said porous material chemically combine.

* * * * *